United States Patent [19]
Ueda et al.

[11] Patent Number: 4,701,746
[45] Date of Patent: Oct. 20, 1987

[54] DEVICE FOR CONVERTING CODE SIGNALS OF ONE BIT NUMBER INTO A CODE SIGNAL OF A SMALLER BIT NUMBER

[75] Inventors: Sigel Ueda, Kamifukuoka; Kozo Matsumoto, Tokyo; Kiyoshi Kanaiwa, Kawasaki; Muneo Adachi, Yokohama, all of Japan

[73] Assignee: Canon Kabushiki Kaisha, Tokyo, Japan

[21] Appl. No.: 772,201

[22] Filed: Sep. 5, 1985

Related U.S. Application Data

[63] Continuation of Ser. No. 358,535, Mar. 16, 1982, abandoned.

[30] Foreign Application Priority Data

Mar. 24, 1981 [JP] Japan ................................ 56-41645

[51] Int. Cl.⁴ .............................................. G11B 20/18
[52] U.S. Cl. .............................. 340/347 DD; 364/900
[58] Field of Search ................. 340/347 DD; 364/200, 364/900; 365/189

[56] References Cited

U.S. PATENT DOCUMENTS 4,254,463  3/1981  Busby et al. ........................ 364/200

Primary Examiner—T. J. Sloyan
Attorney, Agent, or Firm—Fitzpatrick, Cella, Harper & Scinto

[57] ABSTRACT

In a code converting device for converting first code data of scattered code form into second code data of consecutive data form, the first code data are divided at least into a first bit group and a second bit group, and the first bit group is supplied to a first memory to obtain first output data and second output data. The first output data and the second bit group are supplied to a second memory to obtain third output data. The second output data and the third output data are processed in a data processing unit to obtain the second code data.

14 Claims, 8 Drawing Figures

DEVICE FOR CONVERTING CODE SIGNALS OF ONE BIT NUMBER INTO A CODE SIGNAL OF A SMALLER BIT NUMBER

This application is a continuation of application Ser. No. 358,535 filed Mar. 16, 1982 now abandoned.

BACKGROUND OF THE INVENTION

1. Field of the Invention

The present invention relates to a code converting device for converting first code signals into second code signals, and more particularly to a code converting device for converting code signals of a certain bit number into other code signals of a smaller bit number.

2. Description of the Prior Art

Recent computer output with Japanese characters requires 14-bit or 16-bit character codes such as JIS C 6226 standard code instead of conventional 7-bit or 8-bit character codes such as JIS C 6220 standard code. A 16-bit character code system can represent $2^{16} = 65,536$ characters, all of which are however seldom used since actually used characters are limited to 3,000 to 8,000 species. Although a 13-bit character code system corresponding to $2^{13} = 8,192$ codes is theoretically sufficient for representing 8,000 characters, the 16-bit code system is in common use because of the commercial practice or in consideration of the future possibility. For this reason 8,000 characters are suitably allotted in 65,536 character codes.

FIG. 1 shows an example of 16-bit character code system in practical use, in a 8×8 bit map representing the upper or more significant 8 bits in the column direction and the lower or less significant 8 bits in the digit direction. In FIG. 1, the area 100 indicates the entire code area of 65,536 species which can be represented by a 16-bit code system, while the areas 101, 102, 103 and 104 indicate the character code areas actually used. More specifically the character code system shown in FIG. 1 consists of 7,148 codes, i.e. 658 codes of 2121-217E, ..., 2721-277E in the area 101, 6,392 codes of 3021-307E, ..., 7321-737E in the area 102, 1 code of A0A0 in the area 103 and 96 codes of B040-B09F in the area 104, all the addresses being in hexadecimal representation. In this manner the character codes are quite dispersely scattered or uncontinuous. In such system, any other code does not represent any actual pattern.

The use of such dispersed character codes as the addresses of a character pattern memory character generator directly or after arithmetic processing gives rise to a wasted space in the pattern memory, requiring an additional capacity therein. Consequently there has been employed a code converting device for converting such dispersed character codes into consecutive character codes for use in access to the character pattern memory. Such converter theoretically requires a memory of a capacity capable of storing a converting table of $2^{16} = 65,536$ words in order to convert a 16-bit code system into another. In practice, however, the use of such a large memory is quite uneconomical since the number of character codes in actual use is limited to about 8,000 as explained before.

Although the foregoing explanation has been limited to the case of Japanese characters, a similar situation is encountered also in case of coding graphics or patterns.

SUMMARY OF THE INVENTION

The object of the present invention is to provide a code converting device capable, with a simple structure, of converting code signals of a certain bit number into other code signals of a smaller bit number.

Another object of the present invention is to provide a code converting device capable of code conversion with a memory of a limited capacity.

Still another object of the present invention is to provide a code converting device capable of converting code signals of a dispersed code form into code signals of a consecutive or collective code form.

Still another object of the present invention is to provide a code converting device capable of indicating an error signal in response to unconvertable code signals.

Still another object of the present invention is to provide a code converting device capable of providing code signals suitable for accessing a character generator.

DESCRIPTION OF THE PREFERRED EMBODIMENTS

Now the present invention will be clarified in detail by the following description to be taken in conjunction with the attached drawings. The principle underlying the following embodiments is the identification of the number in sequence of a certain character code in all such character codes and using that number as another character code.

Figure 2:
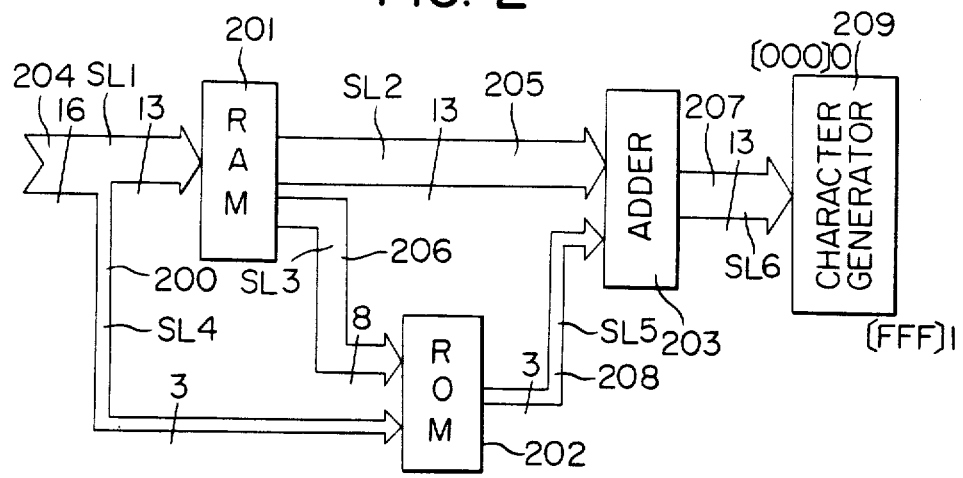
FIG. 2 is a block diagram of a code converting device embodying the present invention.

FIG. 2 shows an embodiment of the present invention wherein the arrows indicate the data flows while the number with a slash attached to each arrow indicates the number of bits constituting said data. In FIG. 2 there are shown a random access memory (RAM) 201 for the receiving upper 13 bits of a 16-bit input code signal 204 through a signal line SL1 and providing a signal line SL2 with a 13-bit data signal 205 constituting a first order signal and a signal line SL3 with an 8-bit data signal 206 constituting a first identification signal; a read-only memory (ROM) 202 for the receiving lower 3 bits of said 16-bit input code signal 204 through a signal line as a second identification signal and said data signal 206 a first identification signal to provide a signal line SL5 with a 3-bit data signal 208 constituting a second order signal; and an adder 203 functioning as processing means for receiving said data signal 205 and the output data signal 208 from the ROM 202 to provide a signal line SL6 with a sum signal 207, which is obtained by code conversion from the aforementioned input code signal 204 and constitutes a 13-bit consecutive code system starting from [000]0, wherein numbers in square parentheses are in hexadecimal representation while a 0 or 1 without parentheses is a binary representation. Said signal 207 can therefore be used as the address signal from a character generator 209 having $2^{13}$ patterns.

Figure 1:
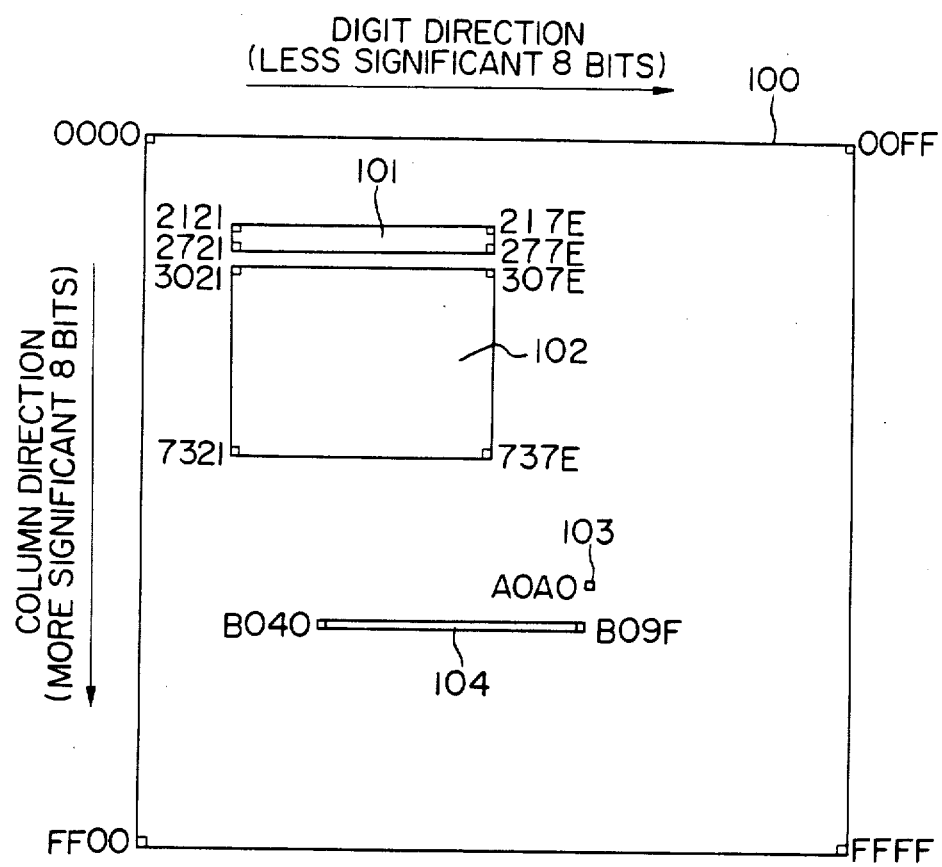
FIG. 1 is an explanatory chart showing an example of a character code system.
Figure 3:
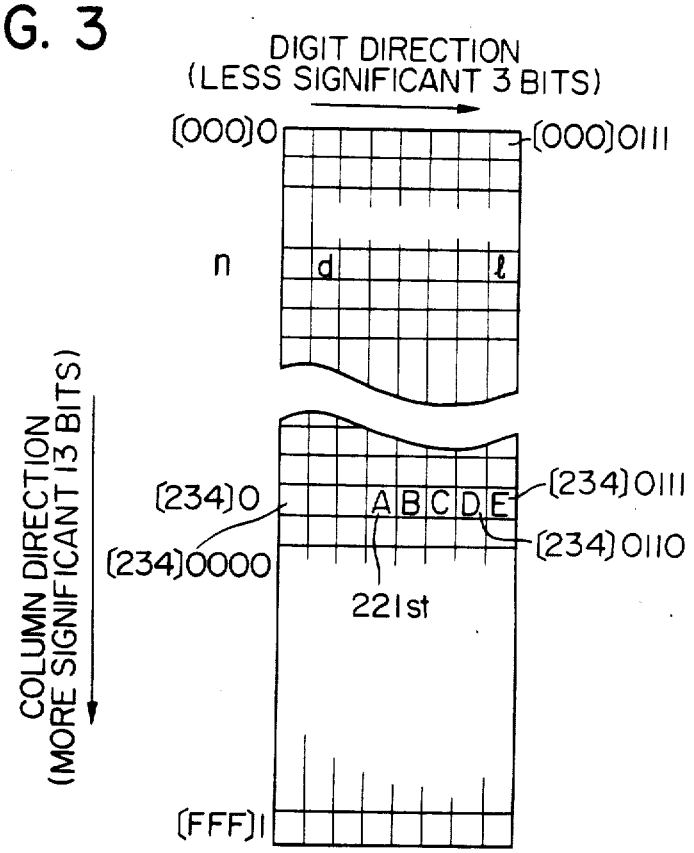
FIGS. 3, 4 and 5 are explanatory charts indicating the function of the code converting device shown in FIG. 2.

In order to facilitate the understanding of the present invention, a map covering areas 0000—FFFF shown in FIG. 1 can be rearranged as shown in FIG. 3, in which each input information signal or input code of 16 bits is shown by a map representing the input code, 213 bits in length and $2^3$ bits in breadth. In the following description it is to be understood that numbers in square parentheses are in hexadecimal representation while 0 or 1 without parentheses are in binary representation.

In this manner the upper 13 bits of the input code 204 shown in FIG. 2 indicate the address of a row of the map shown in FIG. 3, and the lower 3 bits or second identification signal of said input code 204 represent digit position of the map shown in FIG. 3.

Figures 4, 5, 6:
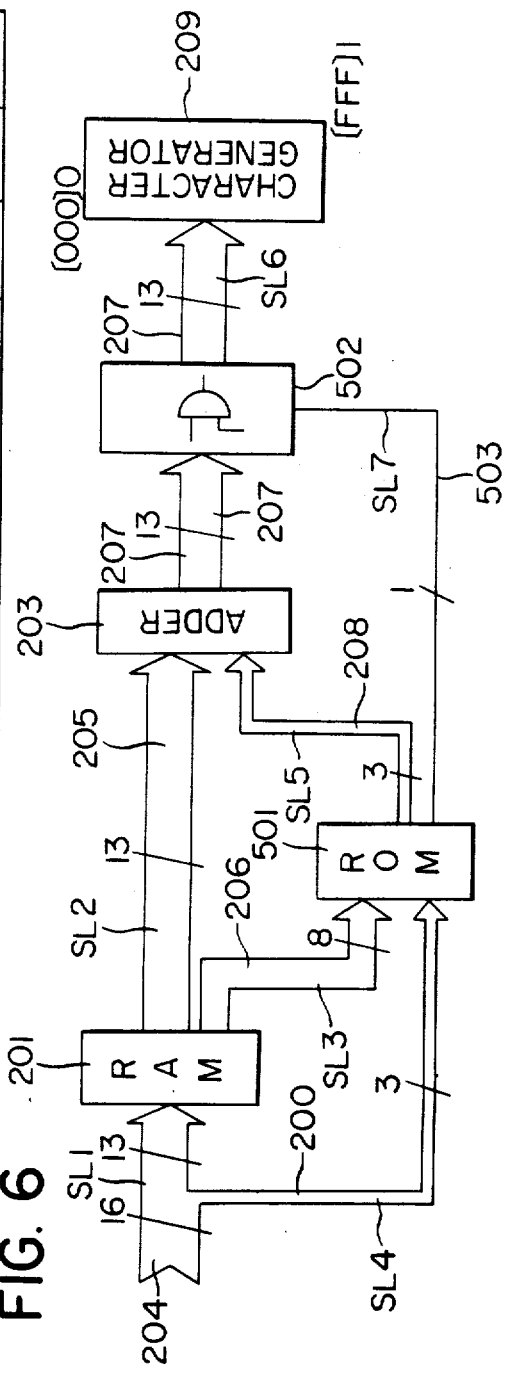
FIG. 6 is a block diagram showing another embodiment of the present invention.

More specifically, as shown in FIG. 4, the lower 3 bits 000, 001, ..., 111 respectively indicate 1st, 2nd, .., 8th column.

In this manner a particular memory area can be addressed by the row using by the upper 13 bits of the input code 204 and by the column addressing in said row by the lower 3 bits of said input code 204.

Figure 7:
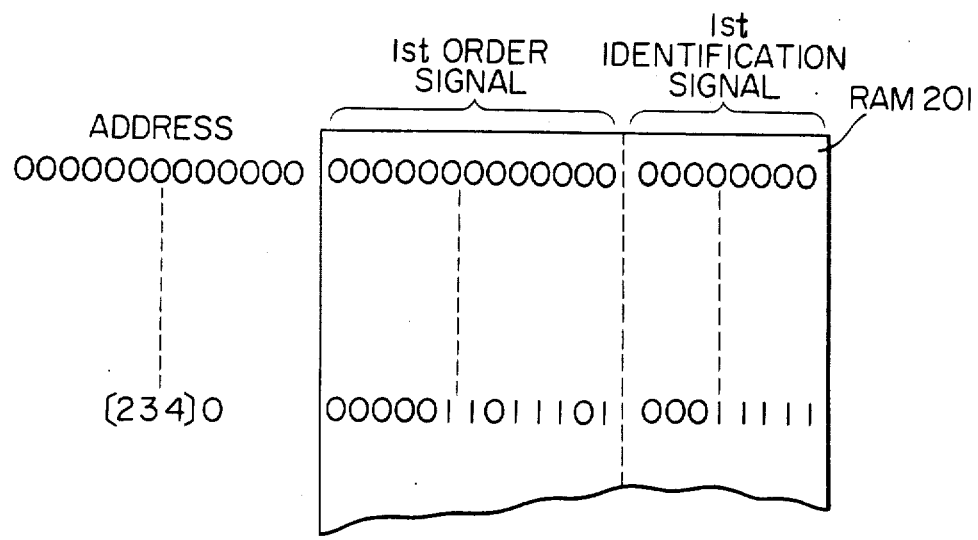
FIG. 7 is a memory map in the random access memory 201 shown in FIG. 2 or 6.

The RAM 201, receiving said upper 13 bits of the input code 204, has the following two pre-stored information as shown in FIG. 7:

1. 8-bit code signals or first identification signals) indicating whether each of the eight addresses in each of the columns in FIG. 3 is an information signal of a first kind that represents a pattern code signal (character code signal), a "1" or "0" being used for representation or non-representation, respectively.

For example, in the n-th column in FIG. 3, the address corresponding to the 2nd digit represents a character code signal for "d", and the address corresponding to the 8th digit is a character code for the letter "l". Thus, bits indicating character code signals are represented are memorized as shown in FIG. 5. The resulting first identification signal in the n-th row is "01000001". As for the [234]0th row in FIG. 3 ([234] being in hexadecimal representation and 0 being in binary representation), addresses corresponding to character code signals for "A" through "E" exist in the 4th digit and thereafter. Thus, the resulting code signal or first identification signal is "00011111".

In this manner an 8-bit code signal representing the presence or absence of registered patterns is stored for each of the rows [000]0 to [FFF]1, and said code signal is supplied from the RAM 201 as the signal 206 (first identification signal).

2. 13-bit code or first order signals indicating the number, serially among all of the character code signals, of the first character code signal stored in the group of character code signals represented by that row or address.

In the [234] row in FIG. 3, for example, [234]0011 (the fourth column) is the first character code signal in that group, and this [234]0011 information signal is the character code signal for "A".

Assume the RAM 201 has addresses corresponding to 220 character code signals in previous addresses, i.e. in the addresses from [000]0000 to [234]0010, the above-mentioned code signal for the character "A" is ranked as 221st among the entire code signals. Consequently the corresponding 13-bit code signal represents said number 221 in binary representation, i.e. 0000011011101 (or 211), shown as a first order signal in FIG. 7. Said 13-bit code signal is supplied from the RAM 201 as the signal 205.

Thus, as shown in FIG. 7, RAM201 stores 13-bit first order signals each indicating the number, serially among all character code signals, of the first information signal (in one group of eight 16-bit information signals) corresponding to a character code, the group of eight 16-bit information signals being addressed by the upper 13 bits of the input code 204, and 8-bit first identification signals each indicating where in the group there is an address corresponding to a character code in said eight 16-bit code. Consequently by supplying the upper 13-bit signal as an address to the RAM 201, the above-mentioned first order signal and the first identification signal are respectively released to the signal lines SL2 and SL3.

Figure 8:
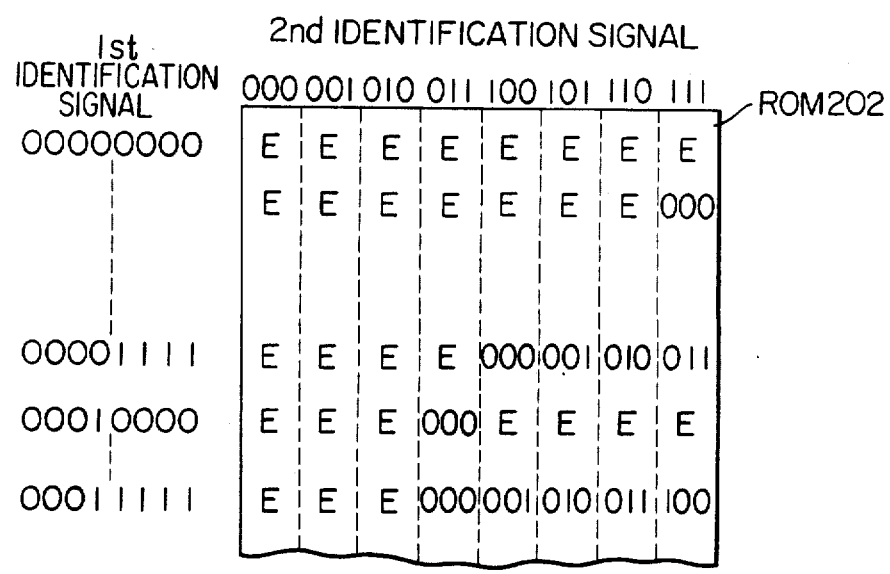
FIG. 8 is a memory map in the random access memory 202 shown in FIG. 2 or 6.

As shown in FIG. 8, the ROM 202 receives the lower 3 bits of the 16-bit input code 204 and the 8-bit signal 206 from the RAM 201, and is so designed as to be capable of generating 3-bit data 208 indicating the serial number of the character code represented by said 3-bit code in a row addressed by the upper 13 bits of said input code, said serial number being counted from the final zero in said row.

As an example, in response to a code signal [234]0110 representing a character "D" on signal line 204, RAM 201 receives [234]0 and the ROM 202 receives the code signal "00011111" from the RAM 201 as a first identification signal 206 and "110" as a second identification signal 200.

These signals representing the row [234]0 indicate that the addresses from the first (000 in binary representation) to the third (010) digits do not correspond to character codes (information signals of the first kind) but the addresses from the fourth (011) to the eighth (111) digits do correspond to character codes, and that the entered information signal corresponds to the address in the 110-th digit in the addressed row.

According to the pre-stored memory, the ROM 202 identifies that the code signal in the 110-th digit corresponds to the 4th code signal and supplies a binary code signal (a second order signal) 011 (i.e. 3, which is the fourth from 0) as the code signal 208 to the adder 203.

The adder 203 thus computes 0000011011101 (or 221)+011 (or 3) to obtain 0000111100000 (or 224), which represents the 13-bit code for the letter "D" in this embodiment.

FIG. 8 shows the data stored in the ROM 202 to be addressed by the first identification signal of the column direction and by the second identification signal in the row direction, wherein E indicates an error code showing the presence of an error in the addresses.

In case of the foregoing example of a character code [234]0110 representing the character "D" supplied through the signal line SL1, RAM 201 receives the upper 13 bits [234]0 of the identification signal and then supplies 0000011011101 (221 in decimal) as the first order signal and 00011111 as the first identification signal, as shown in FIG. 7. ROM 202 receives the first identification signal 00011111 and the last 3 bits 110 of the character code or information signal and then supplies 011 (3 in decimal) as a second order signal. Adder 203 calculates 0000011011101+011 and then supplies 0000111100000. Thus, a 16-bit character code [234]0110, which represents the letter "D", is converted into a 13-bit character code 0000111100000. Since after this conversion, the character "D" can be processed as a 13-bit code signal, the number of bits for a character can be greatly reduced.

The function of the code converting device of the present invention will be further explained by another embodiment.

It is now assumed that n=5 in FIG. 3 and that the address in the 8-th digit (the seventh from 0, i.e. "111") in the n-th column corresponds to the character code for the letter "l". It is to be noted that the present example does not coincide with the map in FIG. 1 in order to simplify the explanation. Thus the input code represented as "0000 0000 0010 1111" corresponds to the letter "l". It is further assumed that said input code, corresponding to the character the letter "l" is fifth code counted from zero among the entire registered codes, that the input code registered in the 2nd digit ("001") in the n-th column corresponds to "d" and that this code for "d" is 4th among all of the character codes or information signals of the first kind.

In response to the upper 13-bit code "0000.0000.0010.1" of the code for the letter "l" in RAM201", the RAM 201 supplies the ROM 202 with data "0100.0001" shown in FIG. 5 as the data signal 206 and supplies the adder 203 with a 13-bit data 205 "0000.0000.0010.0" indicating that the character code at the smallest digit code "001" among addresses corresponding to character codes in the n-th row is 4th counted from zero among the entire character codes. Also in response to the data 206 "0100.0001" and the lower 3 bits "111" of the input code 204, the ROM 202 supplies the adder 203 with data 208 "001" identifying that the code for the character "e" is registered as the second code in the n-th row. Thus the adder 203 adds the data 205 and 208 to obtain the data 207 "0000.0000.0010.1". The character generator 209 makes access to an address corresponding to the data 207 to read a pattern information for the character "e". Also in case of a character "d", the adder 203 releases data "0000.0000.0010.0" in the same manner for making an access to the corresponding address in the character generator thus obtaining the pattern information for said character "d". In this manner the original dispersed input codes are converted into collective or consecutive codes.

FIG. 6 shows another embodiment of the present invention, wherein the same components as those in FIG. 2 are represented by the same numbers.

A read-only memory 501 receives the lower 3 bits of the input code 204 and the data 206 from the RAM 201, and releases data 208 and a signal 503. The data 208 are same as those explained in relation to FIG. 2, while the signal 503 assumes the level-1 or level-0 respectively when an input code is registered or not registered.

The ROM 501, storing error codes as shown in FIG. 8, is adapted to release level-0 signal or a level-1 signal on a signal line SL7 respectively when a memory area addressed by the first and second identification signals contains an error code E or not.

In this manner the data 207 is taken out through a gate 502 to be opened only when a code is registered. On the other hand, if a code is not registered, the gate 502 is closed to release an error code (0000.0000.0000.0) as the data 207. Thus, by storing a predetermined error pattern information in a memory area of the character generator 209 corresponding to said error code, it is rendered possible to display an error pattern in response to the input of an unregistered code. Also such error pattern may be replaced by a blank pattern for later correction.

Since a rewritable random access memory is employed for storing the status of registration of codes in each row corresponding to the upper 13 bits of the input code 204, it is rendered possible to modify the stored data according to the character code system to be employed and thus to achieve code conversion for various code system with a single code converting device. However said random access memory may be replaced by a read-only memory if a determined character code system is to be handled. Furthermore it is possible to process plural character code systems by supplying input codes to plural random access memories 201 connected in parallel and storing different character code systems. Even in such case a single ROM 202 can be employed as already explained in the foregoing. Furthermore the ROM 202 shown in FIGS. 2 and 5 may naturally replaced by a random access memory.

As detailedly explained in the foregoing, the present invention allows to convert dispersed character codes into collective or consecutive character codes with a limited memory capacity in the character code converting device. As an example, in case of converting 16-bit input codes into 13-bit codes, the memory capacity can be reduced from $2^{16} \times 13 = 65536 \times 13$ bits in the conventional device to $2^{13} \times 21 = 8192 \times 21$ bits, corresponding approximately to an 80% economization. Consequently the device can be made less expensive. Also in case the device is to handle a fixed character code system, the random access memory may be replaced by a read-only memory, for achieving further economization of the device.

The input code system and the converted output code system are not limited to those explained in the foregoing but can be selected arbitrarily.

What we claimed is:

1. A device for converting m-bit information signals into n-bit code signals, where n is smaller than m, the device comprising:
   input means for inputting m-bit information signals;
   first output means, which treats an m-bit information signal received from said input means as being in one of a plurality of groups comprising predetermined numbers of information signals, for choosing one of said groups using the input m-bit information signal and for generating a first order signal indicating the number, serially among all the groups of m-bit information signals, of the chosen group of information signals and a first identification signal indicating the locations of particular information signals in the chosen group of information signals;
   second output means for generating, in response to the first identification signal and a second identification signal derived from the input m-bit information signal, a second order signal indicating the number, serially among the particular information signals in the chosen group of information signals, of the input m-bit information signal; and
   obtaining means for obtaining an n-bit code signal, corresponding to the input m-bit information signal, by using the first order signal and the second order signal.

2. A device according to claim 1, wherein said first output means includes memory means for pre-storing the first order signal.

3. A device according to claim 1, wherein said second output means includes memory means for pre-storing the second order signal.

4. A device according to claim 1, wherein said obtaining means includes operation means for operating on the first and second order signals.

5. A device according to claim 2, wherein said memory means includes a RAM.

6. A device according to claim 3, wherein said memory means includes a ROM.

7. A device for converting m-bit information signals into n-bit code signals, where n is smaller than m, the device comprising:
- first output means, which treats an input m-bit information signal as being in one of a plurality of groups comprising predetermined numbers of information signals, for choosing one of said groups using the input m-bit information signal and for generating a first order signal indicating the number, serially among all the groups of m-bit information signals, of the chosen group of information signals and a first identification signal indicating the locations of particular information signals in the chosen group of information signals;
- second output means for generating, in response to the first identification signal and a second identification signal derived from the input m-bit information signal, a second order signal indicating the arrangement of the input m-bit information signal in the chosen group; and
- forming means for forming a predetermined n-bit code signal by using the first order signal and the second order signal.

8. A device according to claim 7, wherein the first identification signal identifies a predetermined kind of m-bit information signal in each group.

9. A device according to claim 7, wherein said forming means forms at least two successive n-bit code signals in response to at least two non-successive m-bit information signals.

10. A device for converting a plurality of m-bit information signals into n-bit code signals, where n is smaller than m, the device comprising:
- output means, which treats an input m-bit information signal as being in one of a plurality of groups comprising predetermined numbers of information signals, for choosing one of said groups using the input m-bit information signal and for generating a first identification signal indicating which m-bit information signals in the chosen group are of a first kind and which are of a second kind and a first order signal indicating the number, serially among all the groups of m-bit information signals, of the chosen group;
- means for generating a second order signal indicating the number, serially among all the information signals of the first kind in the chosen group, of the input m-bit information signal using the first identification signal and a second identification signal derived from the input m-bit information signal; and
- forming means for forming an n-bit code signal by using the first order signal and the second order signal.

11. A device according to claim 10, wherein the information signals of the first kind represent characters.

12. A device according to claim 10, wherein said device converts a non-successive m-bit information signal into a successive n-bit code signal.

13. A device for converting information signals each represented by a 16-bit character selected from information in a 16-bit table into 13-bit code signals, comprising:
- input means for serially inputting first and second 16-bit information signals representing two successive characters in the serial input, the first and second 16-bit information signals being non-successive in the 16-bit table;
- first output means, which treats the 16-bit information signals received from said input means as being in a chosen one of a plurality of groups comprising predetermined numbers of information signals, for receiving the most significant 13 bits of each of the first and second 16-bit information signals input by said input means and generating a first order signal indicating the position among all the groups of 16-bit information signals, of the chosen group and a first identification signal indicating locations of information signals representing characters in the chosen group;
- second output means for generating a second order signal indicating the number, serially among the information signals representing characters in the chosen group, of each of the input 16-bit information signals using the first identification signal and the remaining 3 bits of each of the input 16-bit information signals; and
- summing means for summing the first order signal and the second order signal,
- wherein first and second 13-bit code signals, which are successive and correspond to the inputted first and second 16-bit information signals, are obtained by executing operations of said first and second output means and said summing means for each of the input first and second 16-bit information signals.

14. A device according to claim 13, wherein the first order signal indicates the number, serially among all of the 16-bit information signals, of the first 16-bit information signal representing a character in the chosen group.

* * * * *

UNITED STATES PATENT AND TRADEMARK OFFICE
CERTIFICATE OF CORRECTION

PATENT NO. : 4,701,746            Page 1 of 2

DATED : October 20, 1987

INVENTOR(S) : SIGEL UEDA, ET AL.

It is certified that error appears in the above-identified patent and that said Letters Patent is hereby corrected as shown below:

COLUMN 1

Line 51, "character" should read --(character--.
    Line 52, "erator" should read --erator)--.

COLUMN 2

Line 52, "the receiving" should read --receiving the--.
    Line 57, "the receiving" should read --receiving the--.
    Line 60, "a first identification signal" should read --(a first identification signal)--.

COLUMN 3

Line 9, "213 bits" should read --$2^{13}$ bits--.
    Line 23, "by" (second occurrence) should be deleted.
    Line 29, "signals or" should read --signals (or--.
    Line 40, "are" should read --and--.

COLUMN 4

Line 4, "RAM201" should read --RAM 201--.
    Line 50, "of" should read --in--.

COLUMN 5

Line 14, "the" (second occurrence) should read --or--.
    Line 21, ""0000.0000.0010.1" should read --"0000.0000.0010.1"--.
    Line 22, "RAM201"," should read --RAM 201,--.

UNITED STATES PATENT AND TRADEMARK OFFICE
CERTIFICATE OF CORRECTION

PATENT NO. : 4,701,746

DATED : October 20, 1987

INVENTOR(S) : SIGEL UEDA, ET AL.

It is certified that error appears in the above-identified patent and that said Letters Patent is hereby corrected as shown below:

COLUMN 6

Line 9, "system" should read --systems--.
    Line 19, "naturally" should read --naturally be--.
    Line 37, "claimed" should read --claim--.
    Line 64, "using" should read --arithmetically combining--.

COLUMN 7

Line 33, "using" should read --arithmetically combining--.

COLUMN 8

Line 9, "using" should read --arithmetically combining--.

Signed and Sealed this

Eighteenth Day of April, 1989

Attest:

DONALD J. QUIGG

*Attesting Officer*

*Commissioner of Patents and Trademarks*